US012575384B2

(12) United States Patent
Kitamura

(10) Patent No.: US 12,575,384 B2
(45) Date of Patent: Mar. 10, 2026

(54) METHOD FOR MANUFACTURING SEMICONDUCTOR DEVICE AND PATTERNING METHOD

(71) Applicant: Kioxia Corporation, Tokyo (JP)

(72) Inventor: Masayuki Kitamura, Yokkaichi Mie (JP)

(73) Assignee: KIOXIA CORPORATION, Minato-Ku (JP)

( * ) Notice: Subject to any disclaimer, the term of this patent is extended or adjusted under 35 U.S.C. 154(b) by 847 days.

(21) Appl. No.: 17/891,335

(22) Filed: Aug. 19, 2022

(65) Prior Publication Data

US 2023/0298890 A1 Sep. 21, 2023

(30) Foreign Application Priority Data

Mar. 17, 2022 (JP) ................................. 2022-042949

(51) Int. Cl.
*H01L 21/033* (2006.01)
*H01L 21/311* (2006.01)
(52) U.S. Cl.
CPC ...... *H01L 21/0332* (2013.01); *H01L 21/0337* (2013.01); *H01L 21/31144* (2013.01)

(58) Field of Classification Search
CPC ............. H01L 21/0332; H01L 21/0337; H01L 21/31144; H01L 21/31116; H01L 21/768; H10B 43/27
USPC ...................................................... 430/311, 5
See application file for complete search history.

(56) References Cited

U.S. PATENT DOCUMENTS

| | | | |
|---|---|---|---|
| 10,153,164 B2 | 12/2018 | Nakao et al. | |
| 10,763,122 B2 | 9/2020 | Yamazaki et al. | |
| 2007/0082468 A1* | 4/2007 | Blalock .................. | C23C 16/14 |
| | | | 438/584 |
| 2016/0222505 A1* | 8/2016 | Mebarki ................ | C23C 16/42 |
| 2020/0075341 A1 | 3/2020 | Matsubara et al. | |
| 2021/0082696 A1 | 3/2021 | Min et al. | |
| 2021/0202260 A1 | 7/2021 | Ishikawa et al. | |

* cited by examiner

*Primary Examiner* — Caleen O Sullivan
(74) *Attorney, Agent, or Firm* — Foley & Lardner LLP

(57) ABSTRACT

A method for manufacturing a semiconductor device is disclosed. The method includes forming a mask layer containing a first metal and a first halogen on a film to be processed. The method includes patterning the mask layer. The method includes performing a treatment on the mask layer to decrease the concentration of the first halogen. The method includes processing the film using the treated mask layer as a mask.

18 Claims, 12 Drawing Sheets

13                    13

11b

22

21

22

20

21

22

21

10

METHOD FOR MANUFACTURING SEMICONDUCTOR DEVICE AND PATTERNING METHOD

CROSS-REFERENCE TO RELATED APPLICATION(S)

This application is based upon and claims the benefit of priority from Japanese Patent Application No. 2022-042949, filed Mar. 17, 2022, the entire contents of which are incorporated herein by reference.

FIELD

Embodiments described herein relate generally to a method for manufacturing a semiconductor device and a patterning method.

BACKGROUND

In general, one of various steps for manufacturing a semiconductor device includes, for example, processing a film with a hard mask. With a density of the semiconductor device continuously increasing, it is desirable to form a pattern having a high aspect ratio.

DETAILED DESCRIPTION

Embodiments provide a method for manufacturing a semiconductor device the method that is capable of suitable patterning.

In general, according to one embodiment, a method for manufacturing a semiconductor device includes forming a mask layer containing a first metal and a first halogen on a film to be processed. The method includes patterning the mask layer. The method includes performing a treatment on the mask layer to decrease the concentration of the first halogen. The method includes processing the film using the treated mask layer as a mask.

Hereinafter, embodiments will be described with reference to the drawings. The present disclosure is not limited to the embodiments. The drawings are schematic or conceptual, and ratios of portions, and the like are not necessarily the same as the actual values thereof. In the specification and the drawings, elements identical to those described for the drawings are denoted with identical numbers and characters, and the detailed description thereof will be omitted as appropriate.

First Embodiment

Figure 1:
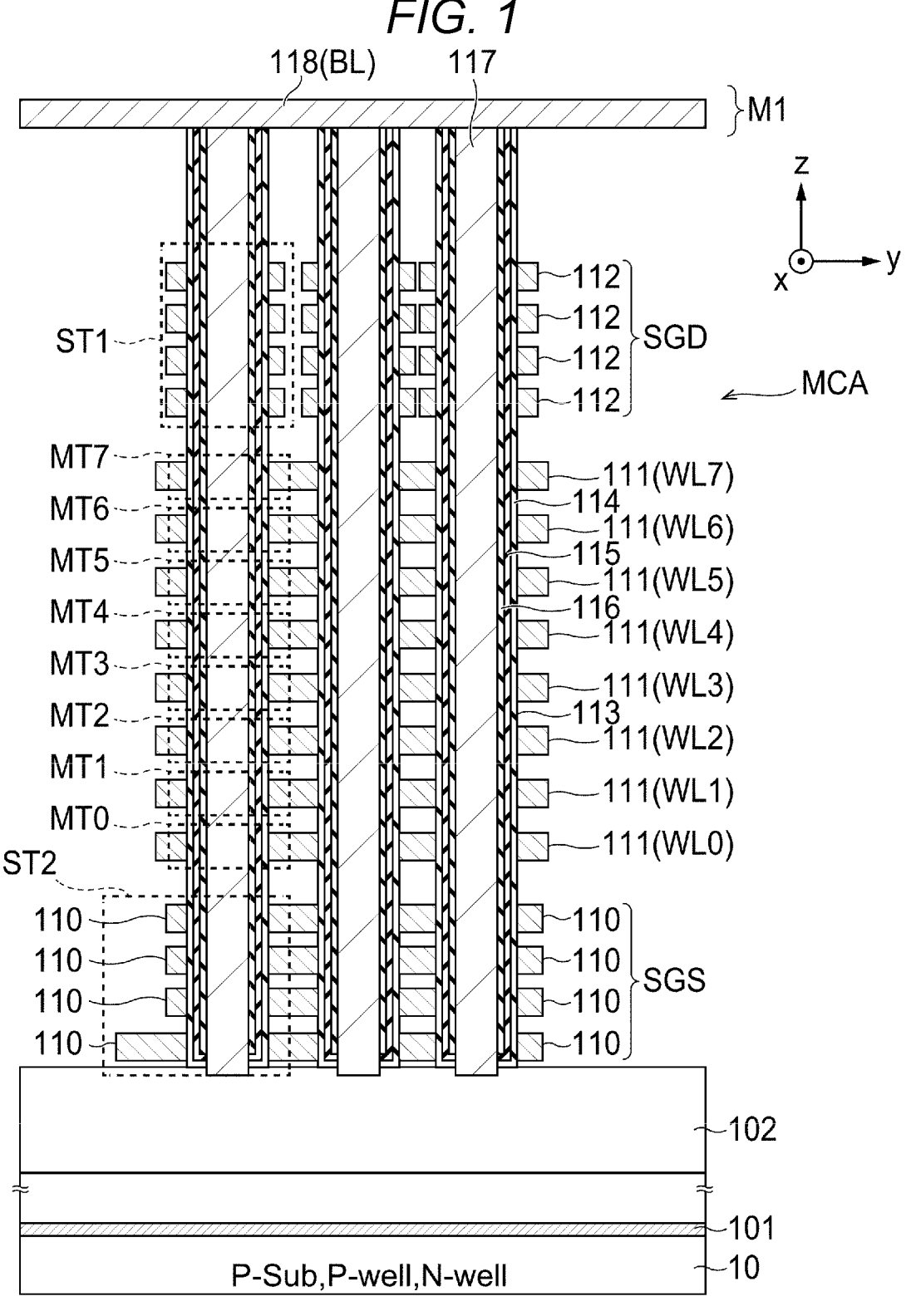
FIG. 1 is a view illustrating an example configuration of a memory cell array of a semiconductor device according to a first embodiment.

FIG. 1 is a view illustrating an example configuration of a memory cell array of a semiconductor device according to a first embodiment. For easy viewing of FIG. 1, illustration of an insulating part other than an insulating film formed in a memory hole 113 is not omitted. In the following embodiment, silicon is exemplified as a semiconductor, but a semiconductor other than silicon may be used.

In this specification, a XYZ coordinate system is introduced for the sake of convenience of description. In this coordinate system, X and Y directions are two directions that are parallel to a main surface of a semiconductor substrate 10 and are orthogonal to each other, and a Z direction is a direction orthogonal to the X and Y directions. A plurality of word lines WL are stacked in the Z direction. For example, the word lines WL may be formed from a conductive material, including tungsten (W) or molybdenum (Mo).

A control circuit 101 that controls a memory cell array MCA is disposed at a surface region of the semiconductor substrate 10. For example, the control circuit 101 includes a CMOS circuit. The CMOS circuit may be disposed in a P-well or a N-well that is disposed at the surface region of the semiconductor substrate 10. The memory cell array MCA including a plurality of memory cells is disposed above the control circuit 101.

A plurality of NAND strings NS are formed on a poly-silicon layer 102 disposed above the control circuit 101. Specifically, a plurality of wiring layers 110 that function as a select gate line SGS, a plurality of wiring layers 111 (word lines WL0 to WL7) that function as a word line WL, and a plurality of wiring layers 112 that function as a select gate line SGD are formed on the polysilicon layer 102.

For example, the wiring layers 110 are four layers, are electrically connected to a common select gate line SGS via the plurality of NAND strings NS, and function as a gate electrode of two select transistors ST2.

For example, the wiring layers 111 are eight layers, and each of the wiring layers 111 is electrically connected to a common word line WL.

For example, the wiring layers 112 are four layers, are connected to a select gate line SGD corresponding to each of the NAND strings NS, and each function as a gate electrode of a select transistor ST1.

The memory hole 113 penetrates the wiring layers 110, 111, and 112 and reaches the polysilicon layer 102. A block insulating layer 114, a charge storage film 115, and a tunnel insulating film 116 are formed in order on the side surface of the memory hole 113. In the memory hole 113, a semiconductor layer 117 is embedded. For example, the semiconductor layer 117 is a polysilicon layer. The semiconductor layer 117 functions as a current pathway of the NAND strings NS. A wiring layer 118 that functions as a bit line BL is formed on an upper end of the semiconductor layer 117. An insulating material core not illustrated is embedded in a center of the semiconductor layer 117.

As described above, the select transistors ST2, a plurality of memory cell transistors MT0 to MT7, and the select transistor ST1 are stacked in order on the polysilicon layer 102, and each memory hole 113 corresponds to each of the NAND strings NS. The memory cell transistors MT0 to MT7 correspond to intersections between the semiconductor layer 117 and the word lines WL0 to WL7.

A plurality of configurations described above are arranged in a depth direction of a paper surface where FIG. 1 is drawn. Thus, the memory cell array MCA includes the memory cell transistors that are three-dimensionally arranged.

Figures 2, 3:
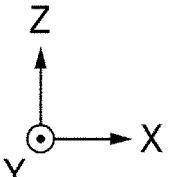
FIG. 2 is an enlarged cross-sectional view of a part in which a semiconductor layer penetrates a plurality of word lines and a plurality of inter-layer insulating layers.
FIG. 3 is a cross-sectional view illustrating an example of a method for manufacturing the semiconductor device according to the first embodiment.

FIG. 2 is an enlarged cross-sectional view of a part in which the respective semiconductor layer 117 penetrates a plurality of word lines WL and a plurality of inter-layer insulating layers 25. For example, the insulating layers 25 include a silicon oxide film. In FIG. 2, an insulating layer between conductive layers WL that is omitted in FIG. 1 is expressed as the insulating layers 25.

The block insulating layer 114, the charge storage film 115, and the tunnel insulating film 116 are provided in order from a side of the conductive layers WL between respective conductive layers WL and the semiconductor layer 117. The block insulating layer 114 is disposed in contact with the conductive layers WL, the tunnel insulating film 116 is disposed in contact with the semiconductor layer 117, and the charge storage film 115 is disposed between the block insulating layer 114 and the tunnel insulating film 116.

The semiconductor layer 117 functions as a channel, the conductive layers WL function as a control gate, and charge storage film 115 functions as a data storing layer that stores a charge injected from the semiconductor layer 117. That is, a memory cell having a structure in which the control gate surrounds the channel is formed at the respective intersections between the semiconductor layer 117 and the respective conductive layers WL.

A semiconductor device according to the embodiment is a nonvolatile semiconductor memory device that can electrically and freely erase and write data, and can store a stored content when a power is turned off. For example, the memory cell is a memory cell having a charge trapping structure. The charge storage film 115 has many traps that trap a charge (electron), and for example, is a silicon nitride film. For example, the tunnel insulating film 116 is a silicon oxide film. When a charge is injected from the semiconductor layer 117 into the charge storage film 115 or when a charge stored in the charge storage film 115 is diffused to the semiconductor layer 117, the tunnel insulating film 116 is a potential barrier. For example, the block insulating layer 114 is a silicon oxide film, and prevents a charge stored in the charge storage film 115 from diffusing in the conductive layers WL. For example, the semiconductor device may be a three-dimensional NAND flash memory.

A method for forming the memory hole 113 will be described below.

FIGS. 3 to 8 are cross-sectional views illustrating an example of a method for manufacturing the semiconductor device according to the first embodiment. In FIGS. 3 to 8, the control circuit 101, the polysilicon layer 102, and the like that are illustrated in FIG. 1 are omitted.

As illustrated in FIG. 3, a stacked body 20 is formed on the semiconductor substrate 10. Specifically, a first film 21 and a second film 22 that is a sacrificial layer are alternately formed in the Z direction, for example, through chemical vapor deposition (CVD) or atomic layer deposition (ALD). For example, the first film 21 includes a silicon oxide film, and the second film 22 includes a silicon nitride film. The stacked body 20 is an example of a film to be processed.

Figure 4:
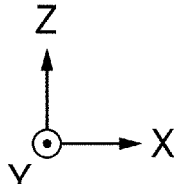
FIG. 4 is a cross-sectional view illustrating an example of the method for manufacturing the semiconductor device that is subsequent to FIG. 3.

Subsequently, a mask layer 11 is formed on the uppermost surface of the stacked body 20, as illustrated in FIG. 4. The mask layer 11 contains a first metal and a first halogen. Hereinafter, a case where the first metal is tungsten (W) and the first halogen is fluorine (F) will be described. More specifically, the mask layer 11 is formed from, for example, a material gas (first gas) containing the first metal and the first halogen and a reducing gas (second gas) for reducing the material gas. The material gas contains tungsten and fluorine. For example, a gas containing tungsten hexafluoride ($WF_6$) can be used as the material gas. The material gas may be a mixed gas containing tungsten and fluorine. For example, a gas containing hydrogen (H) may be used as the reducing gas.

For example, the mask layer 11 may be formed through plasma CVD using the material gas. Specifically, the material gas and the reducing gas are introduced into a chamber (not shown) where plasma is generated.

The mask layer 11 contains a first predetermined concentration of fluorine. For example, the first predetermined concentration is $1\times10^{19}$ atoms/cm$^3$ or more and $1\times10^{20}$ atoms/cm$^3$ (about 0.1%) or less. For example, the mask layer 11 has a thickness of 1 μm to 2 μm.

Figure 5:
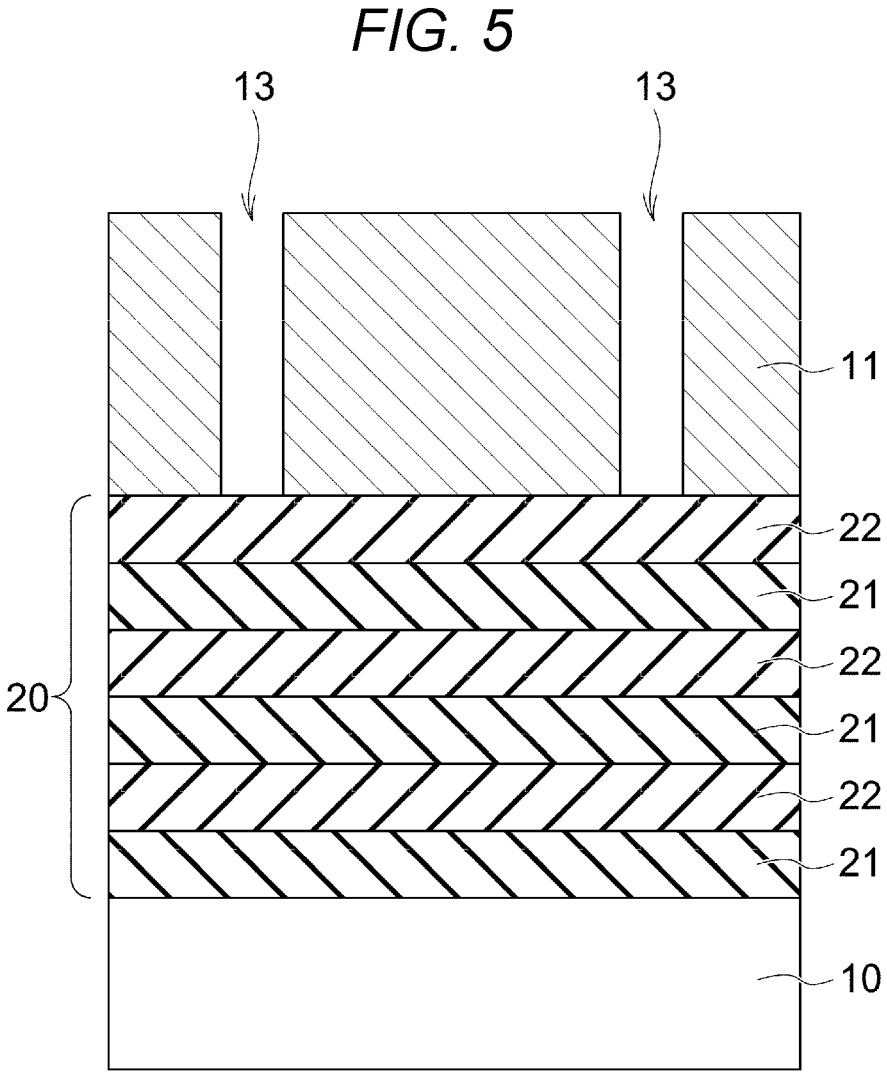
FIG. 5 is a cross-sectional view illustrating an example of the method for manufacturing the semiconductor device that is subsequent to FIG. 4.
Figure 5:
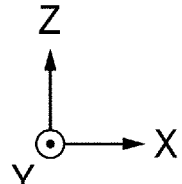

Next, a recess 13 is formed so as to penetrate the mask layer 11, as illustrated in FIG. 5. As a result, a pattern of the recess 13 is formed in the mask layer 11. For example, the recess 13 may be formed through reactive ion etching (RIE) using as a mask a resist or the like not illustrated. Since the mask layer 11 contains fluorine, the fluorine functions as an etchant in etching of the mask layer 11. Thus, the mask layer 11 having a certain thickness can be easily processed.

Figure 6:
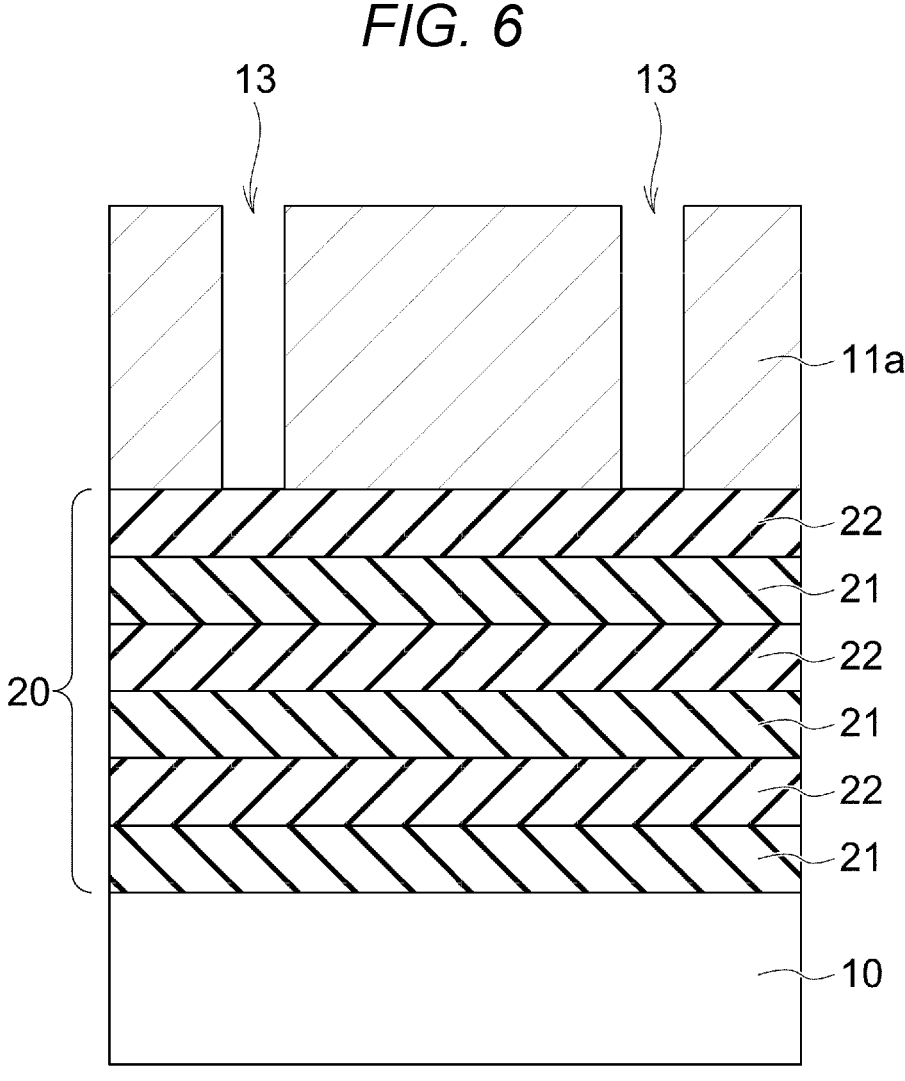
FIG. 6 is a cross-sectional view illustrating an example of the method for manufacturing the semiconductor device that is subsequent to FIG. 5.
Figure 6:
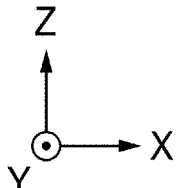

Subsequently, a treatment of decreasing the fluorine concentration (content) in the mask layer 11 (concentration-decreasing treatment) is performed, as illustrated in FIG. 6. For example, the concentration-decreasing treatment includes a heat treatment. The heat treatment is performed, for example, in an argon atmosphere of 700° C. for 3 minutes. The concentration-decreasing treatment is performed so that the fluorine concentration in the mask layer 11 is a second predetermined concentration that is lower than the first predetermined concentration. For example, the second predetermined concentration is $1\times10^{17}$ atoms/cm$^3$ or more and $1\times10^{18}$ atoms/cm$^3$ (about 0.001%) or less. Thus, a mask layer 11a having a fluorine concentration lower than the mask layer 11 is formed.

Figure 7:
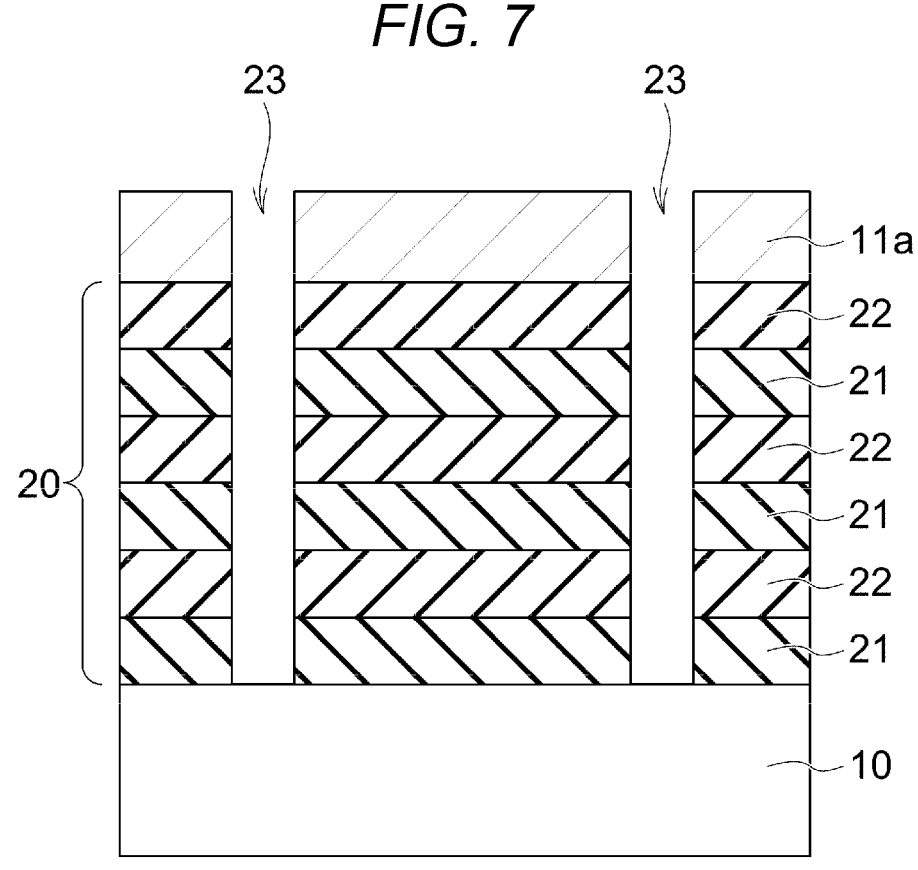
FIG. 7 is a cross-sectional view illustrating an example of the method for manufacturing the semiconductor device that is subsequent to FIG. 6.
Figure 7:
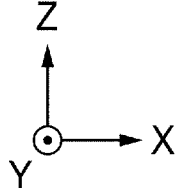

Subsequently, the stacked body 20 is processed by using as a mask the mask layer 11a after the concentration-decreasing treatment, as illustrated in FIG. 7. More specifically, a pattern of a recess 23 is formed in the stacked body 20 on the basis of a pattern of the mask layer 11a. For example, the recess 23 penetrates the stacked body 20. For example, the recess 23 may be formed through RIE using a gas containing carbon (C) and fluorine (F) or a gas containing oxygen (O). For example, the gas containing carbon and fluorine includes $C_4F_6$, $CH_2F_2$, or the like, and the gas containing oxygen includes $O_2$ or the like. A mixed gas containing the gas containing carbon and fluorine and the gas containing oxygen may be used.

Herein, the etching rate of RIE of the mask layer 11 illustrated in FIG. 5 is different from the etching rate of RIE of the mask layer 11*a* illustrated in FIG. 7. That is, the etching rate of the mask layer 11 having a high fluorine concentration is higher than the etching rate of the mask layer 11*a* having a low fluorine concentration. In other words, etching resistance of the mask layer 11*a* having a low fluorine concentration is higher than etching resistance of the mask layer 11 having a high fluorine concentration. Thus, the stacked body 20 can be etched by using the mask layer 11*a* having high etching resistance.

The etching rates of the mask layers 11 and 11*a* can be controlled by controlling the fluorine concentration in the mask layers 11 and 11*a*. For example, by changing the fluorine concentration according to steps, the mask layer 11 having a high etching rate can be subjected to pattern processing, and the stacked body 20 can be processed by using the mask layer 11*a* having a low etching rate as a mask. Thus, the mask can easily be processed, and a pattern having a higher aspect ratio can be formed in the stacked body 20. That is, the recess 23 that is deeper can be formed.

Figure 8:
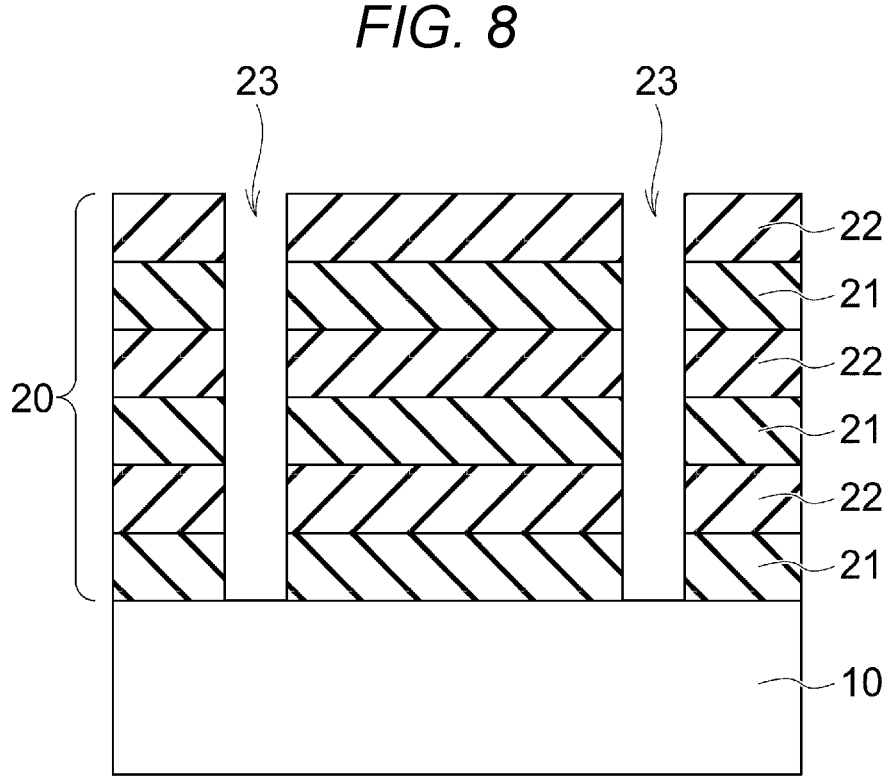
FIG. 8 is a cross-sectional view illustrating an example of the method for manufacturing the semiconductor device that is subsequent to FIG. 7.
Figure 8:
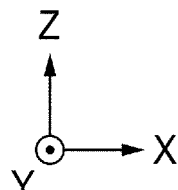

Next, the mask layer 11*a* is removed as illustrated in FIG. 8. In removal of the mask layer 11*a*, a chemical solution can be used. For example, when a hydrogen peroxide ($H_2O_2$) solution is used as the chemical solution, the stacked body 20 is prevented from being damaged, and the mask layer 11*a* can be removed.

After removal of the mask layer 11, a memory film illustrated in FIG. 2 can be form, for example, in the recess 23 that is the memory hole 113. The first film 21 illustrated in FIG. 8 corresponds to the insulating layer 25 illustrated in FIG. 2. After formation of the memory film, the second film 22 illustrated in FIG. 8 is replaced by the respective conductive layers WL illustrated in FIG. 2.

As described above, the mask layer 11 containing tungsten and fluorine is formed and patterned according to the first embodiment. The concentration-decreasing treatment of decreasing the fluorine concentration in the mask layer 11 is performed, and the stacked body 20 is processed by using as a mask layer the mask layer 11*a* after the concentration-decreasing treatment. That is, the mask layer 11 having a comparatively high fluorine concentration and a comparatively high etching rate is patterned. Subsequently, the stacked body 20 is processed by using as a mask the mask layer 11*a* having a comparatively low fluorine concentration and a comparatively low etching rate. Thus, the etching rates of the mask layers can be controlled by controlling the fluorine concentration. Thus, the mask can easily be processed, and a pattern having a higher aspect ratio can be formed in the stacked body 20. That is, the recess 23 that is deeper can be formed.

Next, a comparative example without addition of fluorine will be described.

Figure 9:
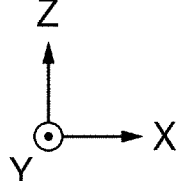
FIG. 9 is a cross-sectional view illustrating an example of a method for manufacturing a semiconductor device according to a comparative example.
Figure 10:
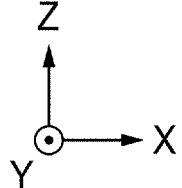
FIG. 10 is a cross-sectional view illustrating an example of the method for manufacturing a semiconductor device that is subsequent to FIG. 9.
Figure 11:
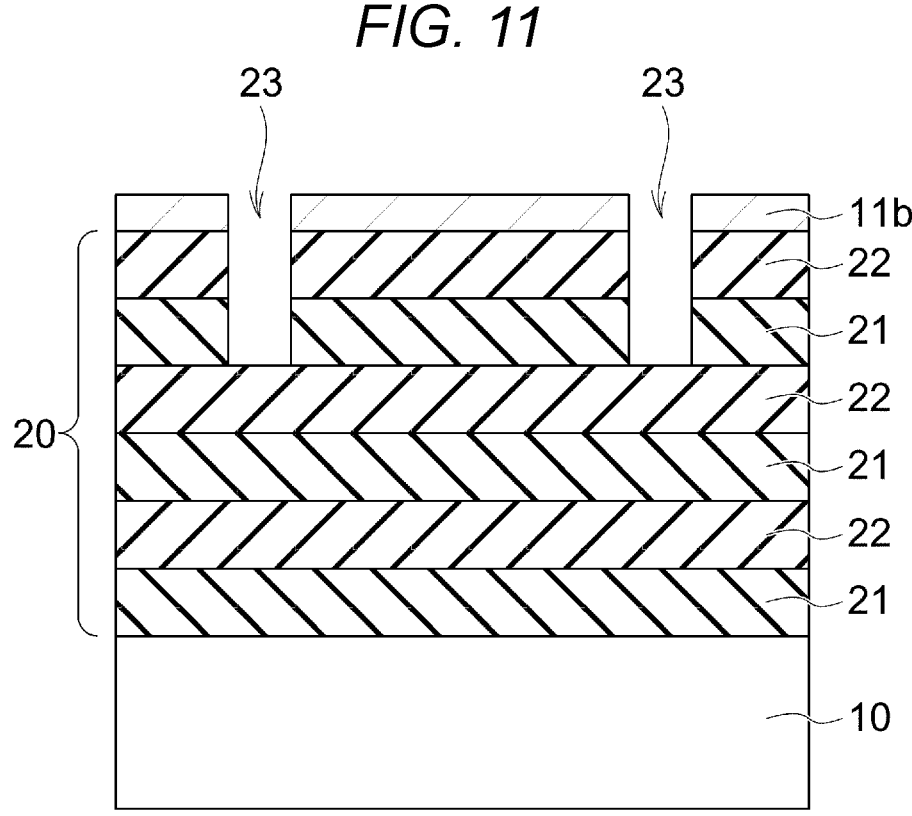
FIG. 11 is a cross-sectional view illustrating an example of the method for manufacturing a semiconductor device that is subsequent to FIG. 10.
Figure 11:
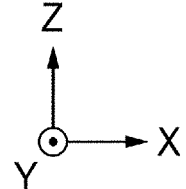

FIGS. 9 to 11 are cross-sectional views illustrating an example of a method for manufacturing a semiconductor device according to the comparative example.

After formation of the stacked body 20 (see FIG. 3), a mask layer 11*b* is formed on the uppermost surface of the stacked body 20, as illustrated in FIG. 9. For example, the mask layer 11*b* may be formed through physical vapor deposition (PVD) such as sputtering. In sputtering, for example, a target containing tungsten is used. In this case, the fluorine concentration in the mask layer 11*b* is about zero.

Subsequently, the recess 13 is formed so as to penetrate the mask layer 11*b*, as illustrated in FIG. 10. As a result, a pattern is formed in the mask layer 11*b*. For example, the recess 13 may be formed through RIE.

Subsequently, the stacked body 20 is processed by using as a mask the mask layer 11*b*, as illustrated in FIG. 11. More specifically, the recess 23 is formed in the stacked body 20 on the basis of a pattern of the mask layer 11*b*. For example, the recess 23 may be formed through RIE.

The mask layer 11*b* illustrated in the comparative example of FIG. 9 has a thickness lower than the thickness of the mask layer 11 illustrated in FIG. 4 in the first embodiment. The recess 23 illustrated in FIG. 11 is shallower than the recess 23 illustrated in FIG. 7 in the first embodiment. When in the comparative example, a metal material having a high etching selectivity ratio in processing of the stacked body 20 is used for the mask layer 11*b*, the mask layer 11*b* is difficult to process. Therefore, a decrease in the film thickness of the mask layer is required. However, a thin mask layer makes it difficult to process the stacked body 20 having a high aspect ratio.

In contrast, a pattern is formed in the mask layer 11 containing added fluorine and having a high etching rate at a step illustrated in FIG. 5 according to the first embodiment. Thus, the mask layer 11 that is thicker can be formed at a step illustrated in FIG. 4 since the mask layer 11 is more easily processed than the mask layer 11*b* in the comparative example. The mask layer 11 can be changed into the mask layer 11*a* having a low etching rate by the concentration-decreasing treatment of decreasing the fluorine concentration. The etching rate of the mask layer 11*a* in the first embodiment is substantially the same as the etching rate of the mask layer 11*b* in the comparative example. Thus, the film thickness of the mask layer 11*a* can be increased as illustrated in FIG. 6. Further, a pattern having a higher aspect ratio can be formed in the stacked body 20, as illustrated in FIG. 7. That is, the recess 23 that is deeper can be formed. Therefore, an increase in etching rate during mask processing and a high selection ratio during processing of the stacked body 20 can be achieved.

The etching rate of the mask layer 11 containing added fluorine is, for example, about 3 times to about 5 times the etching rate of the mask layer 11*a*. Therefore, in the first embodiment, the mask layers 11 and 11*a* can be formed so that the thicknesses of the mask layers 11 and 11*a* are about 3 times to about 5 times the thickness of the mask layer 11*a* in the comparative example. The actual thicknesses of the mask layers 11 and 11*a* are determined according to the thickness of the stacked body 20. As the stacked body 20 is thicker, the mask layers 11 and 11*a* that are thick are required.

Before formation of the mask layer 11 at the step illustrated in FIG. 4, another thin film may be formed on the stacked body 20. For example, the other thin film may be an insulating film, or may be a carbon film, an amorphous silicon film, or the like.

A method for forming the mask layer 11 at the step illustrated in FIG. 4 is not limited to the aforementioned method. For example, a base material such as silicon (Si) is formed on the stacked body 20, and a gas containing $WF_6$ is introduced. Thus, the mask layer 11 may be formed. In this case, the mask layer 11 contain tungsten, fluorine, and silicon.

The stacked body 20 is an example of the film to be processed. The film to be processed is a film in which a deep recess (hole) is formed. For example, the plurality of conductive layers WL that function as a word line are drawn in a direction parallel to the XY surface. The drawn conductive layers WL are connected to a contact plug that extends in the Z direction. The contact plug is formed, for example, in a contact hole that penetrates the interlayer insulating film in the Z direction and reaches the conductive layers WL. In formation of the contact hole, a method for manufacturing a semiconductor device according to the first embodiment may be used. In this case, the film to be processed is an interlayer insulating film. As the interlayer insulating film, for example, an insulating film such as a silicon oxide is used. Thus, the film to be processed may be a single-layer film.

The material gas is not limited to the gas containing tungsten hexafluoride ($WF_6$). The material gas may be a mixed gas containing a gas containing at least one of tungsten hexachloride ($WCl_6$) or tungsten hexacarbonyl ($W(CO)_6$) and a gas containing a fluorine element.

The first metal is not limited to tungsten. For example, the first metal may be Mo, Cr, or the like. When the first metal is Mo, for example, the material gas may a gas containing $MoF_6$, $Mo(CO)_6$, or the like. When the first metal is Cr, for example, the material gas may a gas containing $CrF_6$, $Cr(CO)_6$, or the like.

The first halogen is not limited to fluorine. For example, the first halogen may be Cl, Br, I, or the like. When the first halogen is Cl, for example, the material gas may a gas containing $WCl_6$, $WCl_5$, $WOCl_4$, $WO_2Cl_2$, or the like. When the first halogen is Br, for example, the material gas may a gas containing $WBr_6$, $WBr_5$, $WOBr_4$, $WO_2Br_2$, or the like. When the first halogen is I, for example, the material gas may a gas containing $WI_6$, $WI_5$, $WOI_4$, $WO_2I_2$, or the like.

When the first metal is Mo and the first halogen is Cl, for example, the material gas may be a gas containing $MoCl_6$, $MoCl_5$, $MoOCl_4$, $MoO_2Cl_2$, or the like. When the first metal is Mo and the first halogen is Br, for example, the material gas may be a gas containing $MoBr_6$, $MoBr_5$, $MoOBr_4$, $MoO_2Br_2$, or the like. When the first metal is Mo and the first halogen is I, for example, the material gas may be a gas containing $MoI_6$, $MoI_5$, $MoOI_4$, $MoO_2I_2$, or the like. When the first metal is Cr and the first halogen is Cl, for example, the material gas may be a gas containing $CrCl_6$, $CrCl_5$, $CrOCl_4$, $CrO_2Cl_2$, or the like. When the first metal is Cr and the first halogen is Br, for example, the material gas may be a gas containing $CrBr_6$, $CrBr_5$, $CrOBr_4$, $CrO_2Br_2$, or the like. When the first metal is Cr and the first halogen is I, for example, the material gas may be a gas containing $CrI_6$, $CrI_5$, $CrOI_4$, $Cro_2I_2$, or the like.

Second Embodiment

In a second embodiment, a method for forming the mask layer 11 is different from that in the first embodiment.

At the step illustrated in FIG. 4, the mask layer 11 is formed from a film-forming material containing tungsten and fluorine through PVD. For example, the mask layer 11 is formed by sputtering using a target containing tungsten and fluorine. For example, the fluorine concentration in the target corresponds to the fluorine concentration in the mask layer 11 to be formed.

The mask layer 11 that contains fluorine can be formed from the film-forming material containing fluorine even by PVD.

The method for forming the mask layer 11 may be changed like the second embodiment. A method for manufacturing the semiconductor device according to the second embodiment can achieve the same effects as those in the first embodiment.

Third Embodiment

In a third embodiment, a method for concentration-decreasing treatment is different from that in the first embodiment.

At the step illustrated in FIG. 6, the concentration-decreasing treatment includes a heat treatment in an atmosphere containing a first substance having a binding energy to fluorine that is higher than a binding energy of tungsten to fluorine. The binding energy of the first substance to fluorine is higher than the binding energy of tungsten to fluorine. Therefore, fluorine more easily binds to the first substance than tungsten. For example, the first substance is hydrogen (H). For example, the binding energy of F-H is 570 KJ/mol, and the binding energy of W-F is 544 KJ/mol. Thus, fluorine bound to tungsten is easily removed from the mask layer 11. For example, the heat treatment temperature can be decreased. For example, the heat treatment temperature is about 400° C. to about 500° C. For example, the heat treatment temperature in the first embodiment is about 700° C. to about 800° C.

The heat treatment temperature may be decreased not only by using an atmospheric gas during the heat treatment, but also by performing the heat treatment with applying a high energy such as light. This is because a binding energy is interrupted to decrease a necessary heat energy. For example, light is ultraviolet (UV) light.

The method for concentration-decreasing treatment may be changed like the third embodiment. A method for manufacturing the semiconductor device according to the third embodiment can achieve the same effects as those in the first embodiment.

Fourth Embodiment

Figure 12:
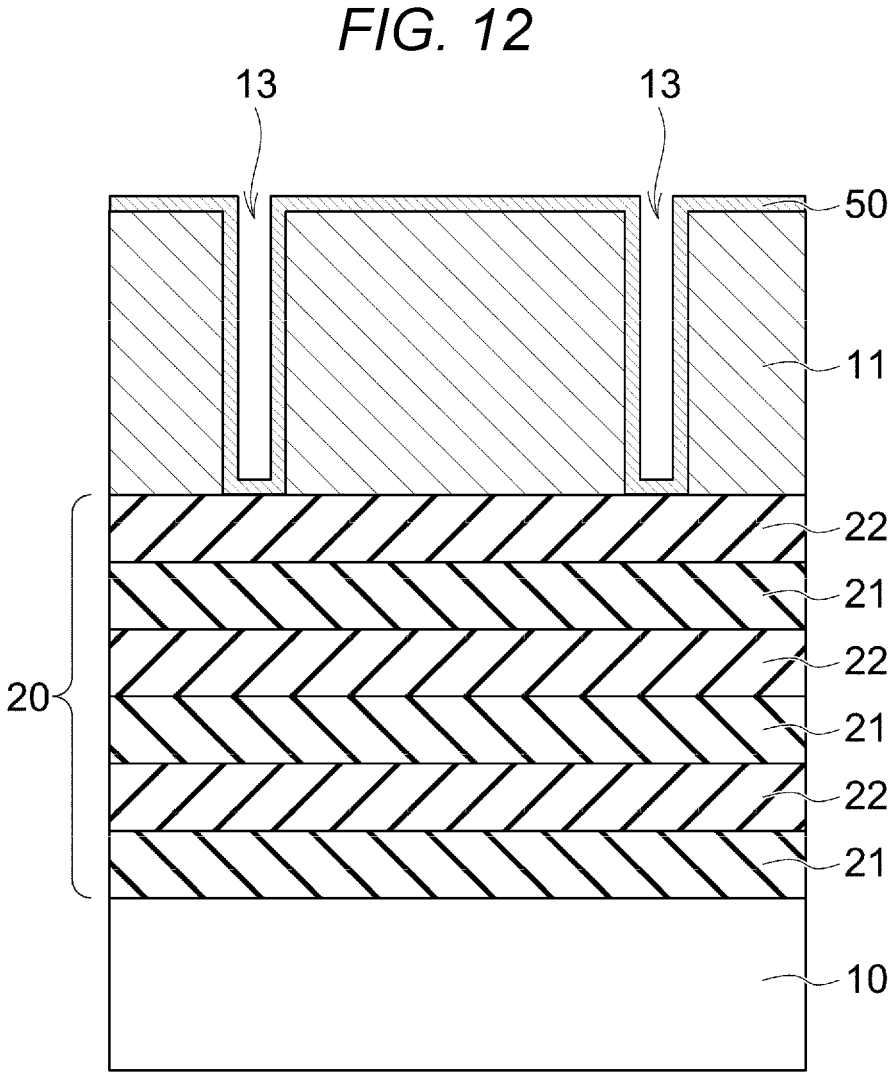
FIG. 12 is a cross-sectional view illustrating an example of a method for manufacturing a semiconductor device according to a fourth embodiment.
Figure 12:
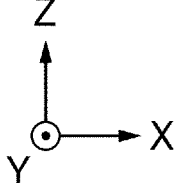
Figure 13:
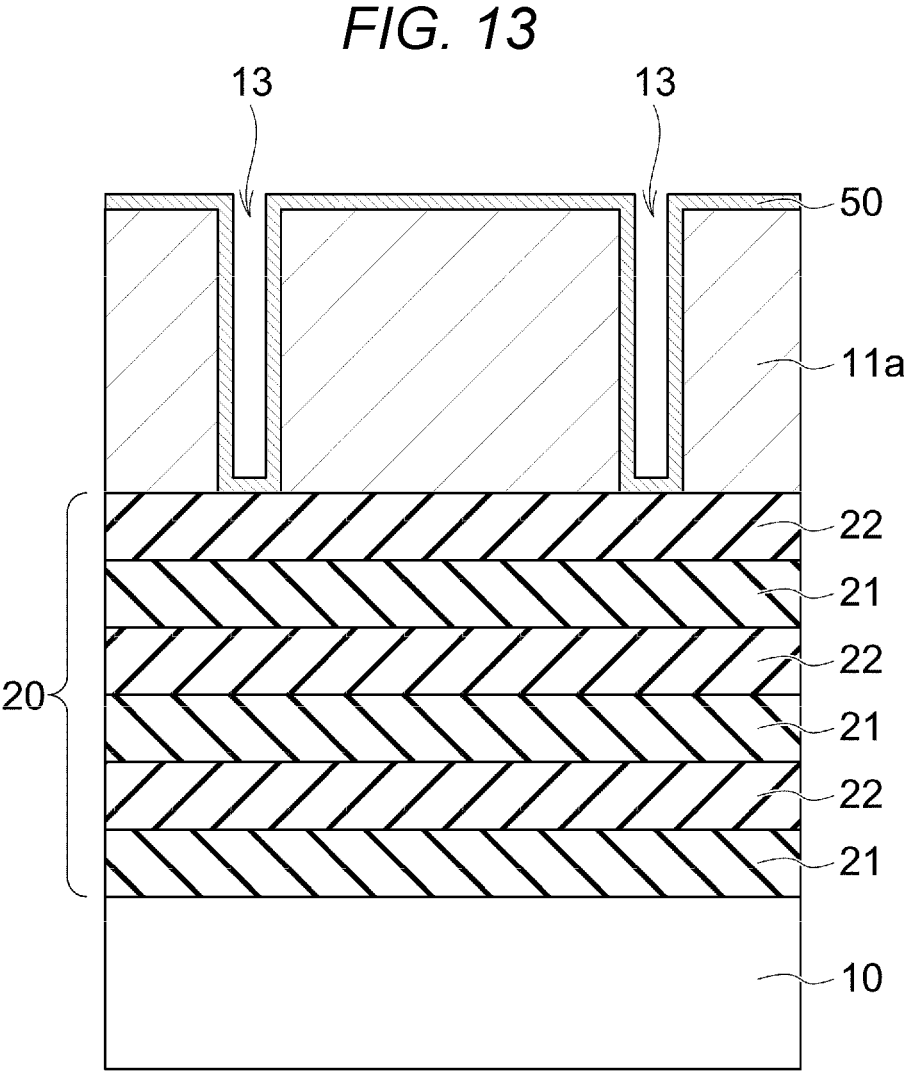
FIG. 13 is a cross-sectional view illustrating an example of the method for manufacturing the semiconductor device that is subsequent to FIG. 12.
Figure 13:
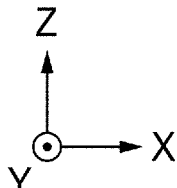

FIGS. 12 and 13 are cross-sectional views illustrating an example of a method for manufacturing the semiconductor device according to a fourth embodiment. In the fourth embodiment, a method for concentration-decreasing treatment is different from that in the first embodiment.

After the recess 13 is formed so as to penetrate the mask layer 11 (see FIG. 5), a material film 50 is formed so as to come into contact with the mask layer 11, as illustrated in FIG. 12. For example, the material film 50 is formed in a liner shape. Thus, the material film 50 is formed on the upper surface of the mask layer 11 and the side surface of the recess 13. Subsequently, a concentration-decreasing treatment of decreasing the fluorine concentration in the mask layer 11 is performed, as illustrated in FIG. 13. For example, the concentration-decreasing treatment includes a heat treatment.

The material film 50 contains a second substance having a binding energy to fluorine that is higher than the binding energy of tungsten to fluorine. The binding energy of the second substance to fluorine is higher than the binding energy of tungsten to fluorine. Therefore, fluorine more easily binds to the second substance than tungsten. For example, the second substance is titanium nitride (TiN). Thus, fluorine bound to tungsten is easily removed from the mask layer 11. For example, the heat treatment temperature can be decreased. For example, the heat treatment temperature is about 300° C. to about 800° C.

After the step illustrated in FIG. 13, the same steps as those in FIGS. 7 and 8 are performed.

The second substance is not limited to titanium nitride. For example, the second substance may be aluminum oxide ($Al_2O_3$), aluminum nitride (AlN), or the like.

The method for concentration-decreasing treatment may be changed like the fourth embodiment. A method for manufacturing the semiconductor device according to the fourth embodiment can achieve the same effects as those in the first embodiment.

Modification of Fourth Embodiment

Selective removal of the material film 50 before processing the stacked body 20 in a modification of the fourth embodiment is different from that in the fourth embodiment.

After the concentration-decreasing treatment (see FIG. 13), the material film 50 is selectively removed. As a result, the mask layer 11a that is patterned is exposed and left like FIG. 6 in the first embodiment. Subsequently, the same steps as those in FIGS. 7 and 8 are performed.

Similarly to the modification of the fourth embodiment, the material film 50 may selectively be removed before processing the stacked body 20. A method for manufacturing the semiconductor device according to the modification of the fourth embodiment can achieve the same effects as those in the fourth embodiment.

In the methods for manufacturing the semiconductor device according to the aforementioned embodiments, the contents of the first to fourth embodiments may each be performed alone, or may be performed in combination.

In the first to fourth embodiments, formation of a recess pattern as a film to be processed in a stacked body is exemplified, but the kind of the film to be processed and the shape of the pattern are not particularly limited.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device comprising:

forming, on a film, a mask layer containing a first metal and a first halogen;

patterning the mask layer;

after patterning the mask layer, performing a treatment on the mask layer to decrease a concentration of the first halogen; and processing the film using the treated mask layer as a mask.

2. The method for manufacturing a semiconductor device according to claim 1, wherein the first metal includes tungsten, and the first halogen includes fluorine.

3. The for manufacturing a semiconductor device according to claim 2, wherein a concentration of the fluorine decreases from $1 \times 10^{19}$ atoms/cm$^3$ or more and $1 \times 10^{20}$ atoms/cm$^3$ or less to $1 \times 10^{17}$ atoms/cm$^3$ or more and $1 \times 10^{18}$ atoms/cm$^3$ or less.

4. The method for manufacturing a semiconductor device according to claim 1, wherein the treatment includes a heat treatment.

5. The method for manufacturing a semiconductor device according to claim 1, wherein the treatment includes a heat treatment in an atmosphere containing a first substance having a binding energy to the first halogen that is higher than a binding energy of the first metal to the first halogen.

6. The method for manufacturing a semiconductor device according to claim 1, wherein the first metal includes tungsten, the first halogen includes fluorine and the first substance includes hydrogen.

7. The method for manufacturing a semiconductor device according to claim 1, further comprising:

after the patterning and before the treatment, forming a material film in contact with the mask layer, the material film containing a second substance having a binding energy to the first halogen that is higher than a binding energy of the first metal to the first halogen.

8. The method for manufacturing a semiconductor device according to claim 7, further comprising:

after the treatment, selectively removing the material film.

9. The method for manufacturing a semiconductor device according to claim 7, wherein the first metal includes tungsten, the first halogen includes fluorine, and the second substance includes titanium and nitrogen.

10. The method for manufacturing a semiconductor device according to claim 1, further comprising:

before forming the mask layer, alternately stacking a first film and a second film to form the film.

11. The method for manufacturing a semiconductor device according to claim 1, further comprising:

forming the mask layer on the film by chemical vapor deposition (CVD) using a gas containing an element of the first metal and an element of the first halogen.

12. The method for manufacturing a semiconductor device according to claim 1, further comprising:

forming the mask layer on the film by physical vapor deposition (PVD) using a film-forming material containing an element of the first metal and an element of the first halogen.

13. The method for manufacturing a semiconductor device according to claim 1, further comprising:

forming the mask layer on the film, the mask layer containing the halogen in a concentration equal to or higher than a first predetermined concentration; and performing the treatment so that the concentration of the first halogen in the mask layer is equal to or less than a second predetermined concentration that is lower than the first predetermined concentration.

14. A patterning method comprising:

forming, on a film, a mask layer containing a first metal and a first halogen on a film;

patterning the mask layer;

after patterning the mask layer, performing a treatment on the mask layer to decrease a concentration of the first halogen; and patterning the film using the treated mask layer as a mask.

15. The patterning method according to claim 14, wherein the first metal includes tungsten, and the first halogen includes fluorine.

16. The patterning method according to claim 14, wherein the treatment includes a heat treatment in an atmosphere containing a first substance having a binding energy to the first halogen that is higher than a binding energy of the first metal to the first halogen.

17. The patterning method according to claim 14, further comprising:

after the patterning and before the treatment, forming a material film in contact with the mask layer, the material film containing a second substance having a binding energy to the first halogen that is higher than a binding energy of the first metal to the first halogen.

18. The patterning method according to claim 17, further comprising:

after the treatment, selectively removing the material film.

\* \* \* \* \*